(12) United States Patent
Wellhausen

(10) Patent No.: US 7,393,756 B2
(45) Date of Patent: Jul. 1, 2008

(54) METHOD FOR FABRICATING A TRENCH ISOLATION STRUCTURE HAVING A HIGH ASPECT RATIO

(75) Inventor: Uwe Wellhausen, Dresden (DE)

(73) Assignee: Infineon Technologies AG, Munich (DE)

(*) Notice: Subject to any disclaimer, the term of this patent is extended or adjusted under 35 U.S.C. 154(b) by 307 days.

(21) Appl. No.: 11/216,527

(22) Filed: Aug. 31, 2005

(65) Prior Publication Data

US 2006/0051931 A1    Mar. 9, 2006

(30) Foreign Application Priority Data

Aug. 31, 2004   (DE)   ............ 10 2004 042 459

(51) Int. Cl.
*H01L 21/76* (2006.01)
(52) U.S. Cl. ............... 438/445; 438/424; 438/440; 438/435; 257/E21.002
(58) Field of Classification Search ........ 438/424, 438/435, 440, 445
See application file for complete search history.

(56) References Cited

U.S. PATENT DOCUMENTS

| | | | | |
|---|---|---|---|---|
| 5,149,669 A | * | 9/1992 | Hosaka | 438/444 |
| 5,248,350 A | * | 9/1993 | Lee | 148/33.2 |
| 5,686,346 A | * | 11/1997 | Duane | 438/439 |
| 6,027,985 A | * | 2/2000 | Jang et al. | 438/443 |
| 6,541,401 B1 | | 4/2003 | Herner et al. | |
| 6,677,197 B2 | | 1/2004 | Kudelka et al. | |
| 2002/0197823 A1 | * | 12/2002 | Yoo et al. | 438/424 |
| 2003/0054630 A1 | | 3/2003 | Kirchhoff | |
| 2003/0170964 A1 | * | 9/2003 | Kao et al. | 438/433 |
| 2004/0126986 A1 | * | 7/2004 | Wise et al. | 438/424 |

FOREIGN PATENT DOCUMENTS

| | | |
|---|---|---|
| DE | 101 43 997 A1 | 3/2003 |
| EP | 1 178 528 A2 | 2/2002 |

* cited by examiner

*Primary Examiner*—Zandra Smith
*Assistant Examiner*—Christy L Novacek
(74) *Attorney, Agent, or Firm*—Slater & Matsil, L.L.P.

(57) ABSTRACT

A method for fabricating a trench isolation structure wherein a trench is formed in a silicon body and an oxide layer is formed in the trench. The silicon body is exposed at the bottom of the trench by means of an etching step, and silicon oxide is selectively grown on the silicon exposed at the bottom of the trench, the silicon oxide being grown from the bottom of the trench toward an upper edge of the trench.

20 Claims, 1 Drawing Sheet

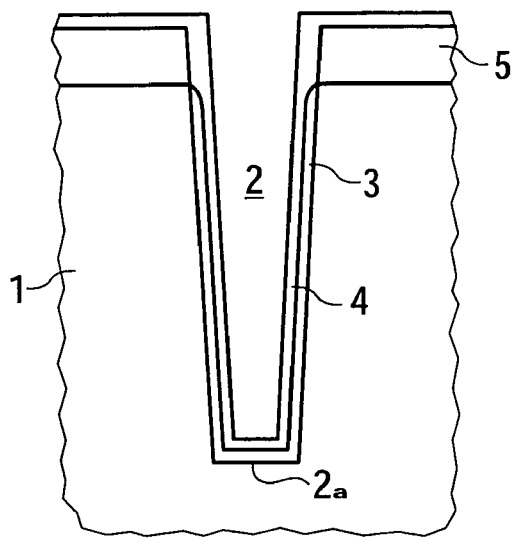
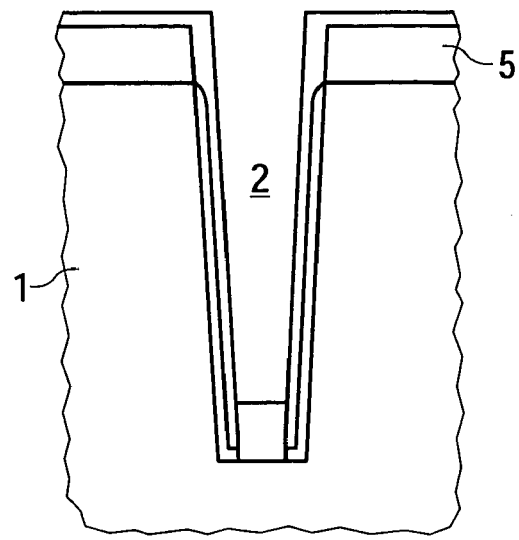
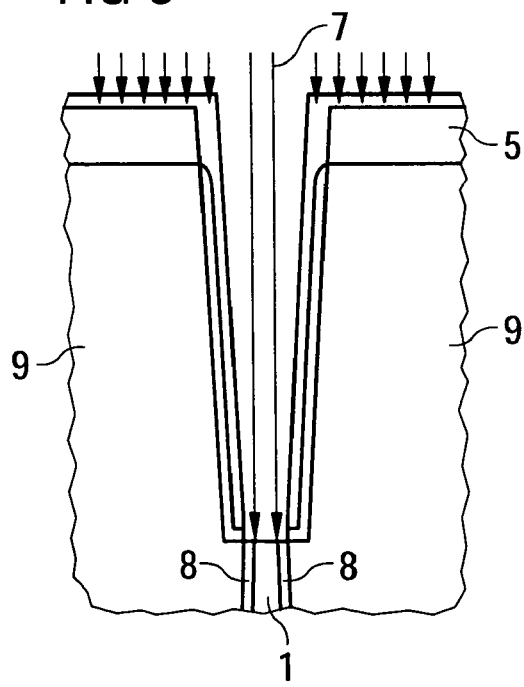
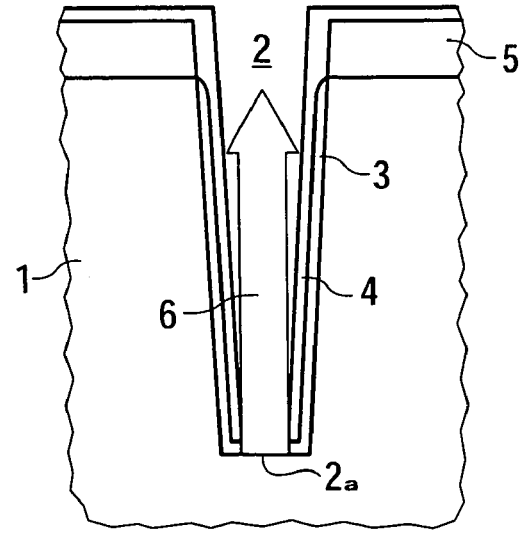

METHOD FOR FABRICATING A TRENCH ISOLATION STRUCTURE HAVING A HIGH ASPECT RATIO

This application claims priority to German Patent Application 10 2004 042 459.4, which was filed Aug. 31, 2004, and is incorporated herein by reference.

TECHNICAL FIELD

The present invention relates generally to semiconductor structures and methods and in a particular embodiment to a method for fabricating a trench isolation structure having a high aspect ratio.

BACKGROUND

The packing density of components in integrated circuits is continuously increasing in the course of advancing miniaturization in semiconductor technology. In order to avoid undesirable interactions between the components, the quality of the isolation of the components among one another is an important aspect of process development.

Besides the traditional LOCOS technique (Local Oxidation of Silicon), STI technology (Shallow Trench Isolation) has been developed for large scale integrated semiconductor chips. In STI technology, trenches are etched into the substrate and are filled with dielectric material. STI structures are typically used in MOS and CMOS technology in order to provide an isolation between adjacent components.

As the packing density increases, the width of these isolation trenches also decreases and their aspect ratio (ratio of height to width) increases. Consequently, filling the isolation trenches becomes more difficult, cavities may be produced in the isolating filling material, as a result of which their isolation property is impaired and thus adversely affects the yield and quality of the product.

The deposition of silicon oxide with the aid of an HDP-CVD process (high density plasma chemical vapor deposition) is known as a method for filling isolation trenches having a high aspect ratio (up to approximately 3:1). As a result of the high plasma density, this process also has a sputtering component in addition to the deposition, as a result of which dense insulation layers can be obtained with good setting of the deposition/sputtering ratio. Numerous modifications of this method are known for obtaining a dense filling (see, for example, U.S. Patent Application Publication No. 2002/0187655, which is incorporated herein by reference). In the transition to sub-100 nm technology, this method nevertheless increasingly poses difficulties with regard to cavity- and seam-free filling of the isolation trenches.

Another isolation possibility consists in realizing the filling process with flowable materials such as, for example, spin-on glass (SOG). Disadvantages of this method are a shrinkage occurring in the filling material and also a necessary complicated aftertreatment (densification, breaking, annealing, etc.).

As an alternative to filling isolation trenches having a very high aspect ratio in the course of 70 nm development, consideration is given to the so-called SelOx method (see, EP 1 178 528, and "SelOx—A Simple Shallow Trench Isolation for 0.25µ Design Rules and below", Siemens Development Report 11/1998, which are incorporated herein by reference), which is based on a selective growth process of silicon oxide on silicon with respect to silicon oxide and nitride. The SelOx method exhibits very good filling properties.

However, the advantages are also opposed by three fundamental disadvantages or problems of the SelOx method. First, after the formation of the isolation trenches, silicon is uncovered in the latter both at the bottom and at the walls. Therefore, the selective oxide grows not only proceeding from the bottom of the trench but also from the sidewalls of the trench. As a result, a seam can form and, at the boundaries between pad nitride and silicon, the SelOx projects upward beyond the later isolation trench, which results in problems in the further process implementation on account of a differing and difficult-to-control etching behavior.

Second, if the isolation trenches are used for isolating DRAM memory cells with trench capacitors, for example, then at those locations at which the isolation trench intersects the trench capacitor, the oxide collar, the so-called collar oxide, is incipiently cut at the upper wall regions of the trench capacitors. Consequently, silicon dioxide rather than silicon is uncovered at these locations, on which silicon dioxide the SelOx exhibits an inhibited growth and tends toward cavity formation in the further course of the growth.

Third, since the isolation trench is severely damaged at the surface directly after the standard RIE etching (reactive ion etching), it is conventional to provide, before the trench is filled with oxide, a thermal oxidation step for annealing or eliminating its damage, in particular with regard to a good leakage and storage behavior of the components. Since uncovered silicon is required for the SelOx method, however, this so-called AA oxidation (oxidation of the sidewalls of the STI trench) has hitherto been effected after the filling of the trench, which, however, entails risks with regard to layer stresses and the quality of the oxide.

SUMMARY OF THE INVENTION

Embodiments of the present invention relate to a method for forming isolation structures during the fabrication of semiconductor components on wafers and in particular to a method for fabricating a trench isolation structure having a high aspect ratio in a silicon substrate, in which the trench etched into the silicon substrate is filled with an oxide that grows selectively on silicon. Embodiments also relate to a method for the trench isolation of DRAM memory cells on a wafer.

In one aspect, the invention eliminates weaknesses and risks of the SelOx process in the use for filling isolation trenches having very high aspect ratios. In particular, the intention is to demonstrate a method for filling an isolation trench with a selectively growing oxide, in which the AA oxidation, as in the earlier HDP processes, can be effected before the trench filling and thus at the optimum point in the process sequence for the performance of the components. Furthermore, a method is sought in which the SelOx grows like a flowable material actually from the bottom toward the upper edge. Moreover, the intention is to prevent cavity formation at the incipient cut of the collar oxide in the trench capacitor and also that the incipient cut of the so-called strap (connection between drain/source junction and storage node electrode).

Advantages are achieved according to embodiments of the invention by virtue of the fact that an oxide layer is formed in the trench after the etching of the latter, then the silicon substrate is uncovered at the bottom of the isolation trench by means of an etching step and silicon oxide is subsequently grown selectively on the silicon uncovered at the bottom of the trench from the bottom toward the upper edge of the trench.

The oxide layer is preferably formed by thermal oxidation.

In accordance with one preferred embodiment of the method according to the invention, it is possible, after the formation of the oxide layer, to deposit on the latter in the trench an intermediate layer that increases the selectivity of the growth process, for example made of silicon nitride or aluminum oxide, which may be applied by means of an ALD process. The intermediate layer can be removed in a subsequent etching step for opening the bottom of the trench at the latter together with the oxide layer.

In this case, the uncovering of the silicon substrate at the bottom of the isolation trench is preferably effected by means of an anisotropic RIE (reactive ion etching) etching step.

In accordance with a further preferred embodiment of the method according to the invention, a species suitable for a surface conditioning (e.g., silicon) is implanted into the bottom of the trench before or after the opening of the bottom of the trench and before the trench is filled with selectively growing silicon oxide.

A further advantageous refinement of the method according to the invention consists in the fact that an annealing and cleaning step or a slight over-etching is effected after the uncovering of the silicon at the bottom of the trench and, if appropriate, the implantation step and before the filling of the trench.

In accordance with a particularly preferred embodiment, the method is suitable for the trench isolation of DRAM memory cells on a wafer, the method comprising the following steps: etching isolation trenches having a high aspect ratio by means of an RIE step; thermal oxidation; optionally depositing an intermediate layer that increases the selectivity of the growth process on the oxide; opening the bottom of the trench by means of an anisotropic RIE etching step; implantation of silicon or some other species suitable for surface conditioning into the bottom of the trench; selectively growing silicon oxide on the silicon uncovered at the bottom of the trench from the bottom toward the upper edge of the trench.

Further features and advantages of the invention can be gathered from the following detailed description and also the appended drawings, in which identical reference symbols designate identical constituent parts.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 shows a sectional view of an isolation trench, which is etched into a silicon substrate and in which intermediate layers are deposited;

FIG. 2 shows a sectional view of the isolation trench from FIG. 1, in which the intermediate layers have been removed at the bottom according to the invention, so that silicon is uncovered at the bottom of the trench;

FIG. 3 shows a sectional view of the isolation trench from FIG. 1 along a sectional line intersecting the trench capacitor of a DT-DRAM cell, with implantation according to the invention into the bottom of the trench; and FIG. 4 shows the growth according to the invention of silicon oxide from the bottom of the trench toward the upper edge thereof.

The following list of reference symbols can be used in conjunction with the figures:

| 1 | Silicon substrate |
| 2 | Isolation trench |
| 3 | Oxide layer |
| 4 | Nitride layer |
| 5 | Pad nitride |
| 6 | Growing silicon oxide |
| 7 | Implantation of silicon |
| 8 | Collar oxide of the trench capacitor |
| 9 | Trench capacitor |

DETAILED DESCRIPTION OF ILLUSTRATIVE EMBODIMENTS

An exemplary embodiment of the method according to the invention will now be explained with reference to FIGS. 1 to 4.

FIG. 1 shows a section through an isolation trench 2 etched into the silicon substrate 1 and having a high aspect ratio (a ratio of depth to width). The trench is usually etched by means of an RIE step (reactive ion etching) with the pad nitride 5 provided on the substrate serving as an etching mask. A thermal oxidation step is then effected, which eliminates the damage caused on the silicon surface by the RIE etching (so-called AA oxidation). After this oxidation step, both the sidewalls and the bottom 2a of the trench are covered with oxide 3, so that the preconditions for a SelOx process for trench filling, which is based on different growth rates of the silicon oxide on silicon with respect to oxide or nitride, are not provided. Therefore, embodiments of the invention propose removing the AA oxide at the bottom 2a of the isolation trench by means of an anisotropic RIE etching step (as shown in FIG. 2). The oxide 3 on the sidewalls remains here. During the subsequent SelOx step, the silicon dioxide, therefore, grows selectively from the bottom of the trench. A sidewall growth and the associated overgrowth of the pad nitride sidewalls are suppressed.

In order to increase the selectivity of the SelOx step, it may be advantageous to deposit above the oxide an intermediate layer 4, for example $Si_3N_4$, that increases the selectivity with respect to silicon (FIG. 1). As an alternative, an $AlO_x$ layer could be applied, preferably by means of an ALD process (deposition in individual atomic layers). The intermediate layer 4 is then removed during the RIE etching step (FIG. 2) at the bottom of the trench together with the oxide.

If the intention is to employ the method according to embodiments of the invention for the isolation of DT-DRAM cells on a wafer that contain a trench capacitor, then the capacitor trenches are incipiently cut by the isolation trenches running transversely with respect thereto. FIG. 3 shows a sectional view of the isolation trench on a sectional line running through the trench capacitors. It can be seen that two trench capacitors 9 are incipiently cut by the isolation trench 2. In this case, the collar oxide 8 provided in the upper region of the capacitor trench on the walls thereof is simultaneously incipiently cut and is thus uncovered at the bottom 2a of the trench, which would result, at these locations, in an inhibited SelOx growth and thus the risk of subsequent cavity formation in the filling material of the trench. As a countermeasure, the invention proposes an implantation 7 into the bottom of the trench for the purpose of conditioning the surface thereof, for example with silicon (FIG. 3).

With regard to the performance of the components, it may be advantageous after the implantation to provide a further annealing step (eliminating surface damage from the etching step from FIG. 2) and also a cleaning step or a slight overetching before the SelOx process. The SelOx process implantation is then effected as usual or with relatively small adaptations.

The method according to embodiments of the invention thus makes it possible to use the silicon/oxide/nitride selectivity of the SelOx process in combination with a spacer technique for realizing a genuine filling process from the bottom to the upper edge of the isolation trench and thus to realize a filling process as with flowable materials without the disadvantages thereof and without cavity or seam formation in the isolation material (FIG. 4).

What is claimed is:

1. A method for fabricating a trench isolation structure, the method comprising:
    forming a high aspect ratio overcut trench in a silicon body, the high aspect ratio overcut trench having sloped sidewalls;
    forming an oxide layer in the high aspect ratio overcut trench;
    exposing the silicon body at the bottom of the high aspect ratio overcut trench by means of an etching step; and
    selectively growing silicon oxide on the silicon exposed at the bottom of the high aspect ratio overcut trench, the silicon oxide being grown from the bottom of the high aspect ratio overcut trench toward an upper edge of the high aspect ratio overcut trench.

2. The method as claimed in claim 1, wherein forming an oxide layer comprises performing a thermal oxidation.

3. The method as claimed in claim 1, wherein exposing the silicon at the bottom of the high aspect ratio overcut trench comprises performing an anisotropic reactive ion etching.

4. The method as claimed in claim 1, further comprising effecting an annealing and cleaning step after exposing the silicon at the bottom of the high aspect ratio overcut trench and before the filling of the high aspect ratio overcut trench.

5. The method as claimed in claim 1, further comprising depositing an intermediate layer that increases the selectivity of the growth process on the oxide in the high aspect ratio overcut trench, the intermediate layer being removed from the bottom of the high aspect ratio overcut trench together with the oxide layer during the exposing step.

6. The method as claimed in claim 5, wherein the intermediate layer comprises silicon nitride.

7. The method as claimed in claim 5, wherein the intermediate layer comprises aluminum oxide.

8. The method as claimed in claim 7, wherein the aluminum oxide is deposited in an ALD process.

9. The method as claimed in claim 1, further comprising implanting a species suitable for surface conditioning into the bottom of the high aspect ratio overcut trench before the high aspect ratio overcut trench is filled with selectively growing silicon oxide.

10. The method as claimed in claim 9, wherein the species suitable for surface conditioning comprises silicon.

11. The method as claimed in claim 9, wherein the implanting into the bottom of the high aspect ratio overcut trench is effected before the exposing step.

12. The method as claimed in claim 9, wherein the implanting into the bottom of the high aspect ratio overcut trench is effected after the exposing step.

13. The method as claimed in claim 1, wherein the silicon body comprises a silicon substrate.

14. The method as claimed in claim 13, wherein the silicon substrate contains active areas and also trench capacitors for DRAM memory cells, and wherein the active areas are insulated from one another by the trench isolation structure.

15. A method for the trench isolation of DT-DRAM memory cells on a wafer, the method comprising:
    etching overcut isolation trenches having a high aspect ratio and sloped sidewalls by means of an RIE step;
    performing a thermal oxidation to form an oxide layer along the sidewalls and a bottom of the overcut trench;
    removing the oxide layer at the bottom of the overcut trench by means of an anisotropic RIE etching step;
    implanting a species suitable for surface conditioning into the bottom of the overcut trench; and
    selectively growing silicon oxide on silicon uncovered at the bottom of the overcut trench, the silicon oxide being grown from the bottom toward the upper edge of the overcut trench.

16. The method as claimed in claim 15, wherein the species suitable for surface conditioning comprises silicon.

17. The method as claimed in claim 15, wherein, after the thermal oxidation, an intermediate layer that increases the selectivity of the growth process is deposited in the overcut trench, the intermediate layer being removed from the bottom of the overcut trench during the RIE etching step.

18. The method as claimed in claim 17, wherein the intermediate layer comprises silicon nitride or aluminum oxide.

19. The method as claimed in claim 15, further comprising effecting an annealing and cleaning step after removing the oxide layer at the bottom of the overcut trench and implanting but before selectively growing silicon oxide.

20. The method as claimed in claim 19, wherein the cleaning step is affected by means of slight over-etching.

* * * * *